(12) United States Patent
Lee et al.

(10) Patent No.: US 6,929,967 B2
(45) Date of Patent: Aug. 16, 2005

(54) METHOD OF FORMING PATTERN

(75) Inventors: Yun Bok Lee, Seoul (KR); Dong Hoon Lee, Kyonggi-Do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/303,039

(22) Filed: Nov. 25, 2002

(65) Prior Publication Data

US 2003/0124757 A1 Jul. 3, 2003

(30) Foreign Application Priority Data

Dec. 27, 2001 (KR) .......................... 2001-86069

(51) Int. Cl.⁷ .............................................. H01L 21/00
(52) U.S. Cl. ...................................................... 438/30
(58) Field of Search ........................................... 438/30

(56) References Cited

U.S. PATENT DOCUMENTS

| | | | |
|---|---|---|---|
| 4,752,553 A | | 6/1988 | Sullivan |
| 6,071,827 A | * | 6/2000 | Lim et al. .................... 438/725 |
| 6,239,551 B1 | * | 5/2001 | Park ............................. 313/582 |
| 6,348,233 B2 | * | 2/2002 | Brody et al. ................. 427/117 |
| 6,383,891 B1 | * | 5/2002 | Okamoto ...................... 438/455 |
| 6,639,315 B2 | * | 10/2003 | Miura et al. ................. 257/738 |
| 2001/0039891 A1 | * | 11/2001 | Takeuchi et al. ....... 101/128.21 |
| 2001/0046553 A1 | * | 11/2001 | Umemoto et al. ............. 427/68 |
| 2002/0007743 A1 | * | 1/2002 | Yamasaki et al. ........... 101/129 |
| 2002/0034872 A1 | * | 3/2002 | Kazama et al. ............. 438/613 |
| 2003/0048074 A1 | * | 3/2003 | Ni et al. ...................... 313/512 |
| 2003/0056665 A1 | * | 3/2003 | Tanaka ...................... 101/127.1 |
| 2003/0151362 A1 | * | 8/2003 | Alberto et al. .............. 313/586 |

FOREIGN PATENT DOCUMENTS

| | | | |
|---|---|---|---|
| JP | 1993-164059 | * | 10/1991 |
| JP | 406251704 A | * | 9/1994 |
| KR | 1986-2739 A | | 4/1986 |
| KR | 1989-5034 Y1 | | 7/1989 |

* cited by examiner

*Primary Examiner*—Long Pham
(74) *Attorney, Agent, or Firm*—Birch, Stewart, Kolasch & Birch, LLP

(57) ABSTRACT

A method of forming a pattern suitable for fabricating a liquid crystal device which includes the steps of forming a film on a substrate, printing a resist pattern by having the film covered with a screen mask, etching the film using the resist pattern as a mask, and stripping the resist pattern.

6 Claims, 5 Drawing Sheets

METHOD OF FORMING PATTERN

BACKGROUND OF THE INVENTION

This application claims the benefit of the Korean Application No. P2001-86069 filed on Dec. 27, 2001, which is hereby incorporated by reference.

1. Field of the Invention

The present invention relates to a method of forming a pattern suitable for fabricating a liquid crystal display device.

2. Discussion of the Related Art

As information society develops, the demand for various displays is increased. Recently, many efforts have been made to develop various flat display panels such as LCD (liquid crystal display device), a PDP (plasma display panel), a ELD (electroluminescent display), a VFD (vacuum fluorescent display), and the like. Some species of flat display panels are already applied to displays of various systems and devices.

LCD is widely used because of the characteristics or advantages of a high quality image, lightness, a thin & compact size, and low power consumption, to be used as a substitution for the CRT (cathode ray tube) of a mobile image display. A LCD is also developed to be applicable to such devices receiving broadcasting signals to display such as a television, a computer monitor, and the like.

Even if various technical developments of the LCD have been made to play a role as an image display in various fields, the image quality as an image display fails to meet the characteristics and advantages of the LCD. In order to apply the liquid crystal display as a general display device for various fields, the development of the LCD depends on realizing a high quality image with high resolution, high brightness, a wide screen, and the like, while maintaining the characteristics of lightness, compactness (thin), and low power consumption.

Such a liquid crystal display mainly includes a liquid crystal panel displaying an image and a driving unit for applying a driving signal to the liquid crystal panel. The liquid crystal panel includes first and second glass substrates bonded to each other so as to leave a predetermined space therebetween and a liquid crystal layer injected between the first and second glass substrates.

In this case, formed on the first glass substrate (TFT array substrate) are a plurality of gate lines arranged in one direction to define a predetermined interval between each other, a plurality of data lines arranged in a direction perpendicular to respective gate lines to define a predetermined interval between each other, a plurality of pixel electrodes formed like a matrix in pixel areas defined by the respective gate and data lines crossing each other, and, a plurality of thin film transistors switched by signals from the gate lines to transfer the signals of the data lines to the pixel electrodes, respectively.

A black matrix layer is formed on the second glass substrate (color filter substrate) for cutting off light from portions other than the pixel areas. An R/G/B color filter layer realizing colors, and a common electrode are also formed for realizing an image.

The above-constituted first and second substrates are separated from each other by spacers, and. bonded to each other through a sealant. Liquid crystal material is then injected between the first and second substrates.

In a general process for fabricating an integrated circuit, a transistor, a liquid crystal device, or a diode, a photolithographic process for forming a micro pattern and/or an etching process for forming an electrode pattern connected to the micro pattern are used.

For instance, in order to form a semiconductor layer having a required pattern on a glass substrate, a semiconductor (polysilicon or amorphous silicon) layer, an insulating layer, or a line layer is formed on a surface of the glass substrate, a cleaning process is carried out on the formed layer, and photoresist suitable for the required pattern is successively coated on the cleaned layer. It is assumed that the semiconductor layer is formed for explanation.

First of all, the photoresist is coated by one of various methods such as spin coating, stray coating, dip coating, and the like. Spin coating is carried out in a manner wherein a wafer is spun at high speed, and is widely used for the sake of stability and uniformity.

Subsequently, a photomask corresponding to the required pattern is disposed over the photoresist, and UV-rays are applied thereto to carry out the exposure. Development is then carried out to form the required photoresist pattern.

In this case, development is carried out by immersion or spray. The former has difficulty in managing temperature, concentration, variations according to time, etc, while the latter is relatively effective in managing such parameters. Currently, in-line equipment using the spray technique is widely used.

Thereafter, the layer is selectively removed using the photoresist pattern as a mask to form the demanded pattern.

Meanwhile, the photoresist, which has been used as the mask for forming the semiconductor layer having the required pattern, is resolved by various methods such as oxygen gas plasma, various oxidizers, and the like. The method using oxygen gas plasma is generally carried out in a following manner. Oxygen gas plasma is generated by injecting an oxygen gas in the ambience of a vacuum and high voltage whereby the photoresist reacts with the oxygen gas plasma to be decomposed for removal.

However, the method of using oxygen gas plasma requires an expensive plasma generator for generating the oxygen gas plasma, and also has the problem that the wafer, including other devices is damaged by rotating particles existing in the oxygen gas plasma.

The well-known methods which use various oxidizers for resolving the photoresist utilize sulfuric acid ($H_2SO_4$) or a mixture of sulfuric acid ($H_2SO_4$) and hydrogen peroxide as the oxidizer.

Generally, the photoresist is divided into a negative photoresist and a positive resist. Compositions of the negative photoresist include a mixture of a hardening rubber based resin and a bis-diazide based compound dissolved in an organic solvent. The latter is photo-reactive to function as a cross-linking agent. A portion of the negative photoresist, to which light is applied, turns into a mesh structure to be hardened. The hardened portion produces a solubility difference from the other portion of the negative photoresist which was not exposed to the light for development, whereby the pattern is formed.

On the other hand, a light-exposed portion of the positive photoresist is dissolved in a developing solution (alkaline), and the non-exposed portion of the photoresist is not dissolved in the developing solution. Hence, the pattern is attained using the solubility difference, like in the case of the negative photoresist.

In general, the composition of the positive photoresist includes a quinone-diazide based photo-reactive agent, an alkaline-soluble phenol based resin, and an organic solvent. The mixture itself is insoluble but becomes alkaline-soluble by light irradiation.

Hence, the fabrication of the liquid crystal display device requires, in general, a repetition of the process using photoresist, whereby the process of removing the photoresist is repeated as well.

The method of forming a pattern according to related art is explained by referring to the attached drawings as follows.

FIGS. 1A to 1D illustrate cross-sectional views of a method of forming a pattern according to the related art.

Referring to FIG. 1A, a film 12 is formed on a substrate 11, and a photoresist 13 as a photo-reactive material is coated on the film 12.

In this case, the photoresist 13 is coated by one of various methods such as spin coating, stray coating, dip coating, and the like. Spin coating is carried out in a manner that a wafer is spun at high speed, and is widely used for the sake of stability and uniformity.

The thickness of the photoresist 13 depends on the RPM of a spinner, the viscosity of resist, the temperature, the solid content, the resist dropping quantity of the nozzle, and the like.

Subsequently, a soft bake is carried out for about 130 seconds at a relatively low temperature of about 80° C. to volatilize the organic solvent in the photoresist 13 coated on the substrate 11.

Referring to FIG. 1B, a mask 15 defined by a light-penetrating part and a light-blocking part is aligned over the substrate 11, and then an exposure process is carried out on the entire surface of the mask 15. After the mask 15 has been disposed for alignment over the substrate 11 coated with the photoresist 13, UV-rays are applied to the entire surface. The alignment disposition is carried out by automation using an alignment-disposition pattern printed on the substrate 11 by a previous mask-preparing process.

In this case, the exposure process is standardized in that the pattern is printed by exposure using UV-rays. The energy source for light irradiation can be selected from one of deep UV, electron beam, X-rays, ion beam, laser, and the like.

Referring to FIG. 1C, the photoresist 13 on the substrate 11 is developed to define a photoresist pattern.

In this case, a development process is carried out for obtaining the pattern using the solubility difference between the exposed portion and the non-exposed portion. Hence, management of time, temperature, and the like is important. Finally, the resolution or sensitivity of the pattern is determined by the developing process.

Such a development is carried out by immersion or spray. The former has difficulty in managing temperature, concentration, variation according to time, etc, while the latter facilitates the management of such parameters. Currently, in-line equipment using the spray technique is widely used.

In order to remove the residue of the developing solution and the like after development, a rinsing process is carried out as well.

Subsequently, a hard bake process is carried out on the patterned photoresist 13 for 150 seconds at a high temperature of about 150~200° C.

The hard bake process is a process for printing the photoresist 13 determined by development, and is carried out in a manner wherein thermal treatment is carried out on the photoresist 13 to improve adhesion to the bottom as well as an anti-etch characteristic since organic components and portions failing to harden remain in the photoresist 13 after exposure and development.

If the photoresist is positive, the exposed portion is developed. If negative, the non-exposed portion is developed.

Thereafter, an exposed portion of the film 12 is etched using the patterned photoresist 13 as a mask. The photoresist 13 used as the mask is stripped off the substrate 11 using a photoresist stripper, whereby the patterned film 12, as shown in FIG. 1D, remains on the substrate 11.

Patterns having various shapes are formed on the substrate using the above-explained method.

For instance, FIG. 2 illustrates a cross-sectional view of a general liquid crystal display device.

Referring to FIG. 2, the above-explained photolithography process is used for forming gate and data lines crossing each other on a first substrate 18, a thin film transistor formed at an intersection between the gate and data lines, a pixel electrode 22 connected to the thin film transistor 21, a black matrix 23 formed on a second substrate 23, a color filter layer 24 of R/G/B, and a common electrode 25.

The liquid crystal display device further includes a sealant 26 bonding the first and second substrates 18 and 19 to each other and a spacer 27 for maintaining a gap between the first and second substrates 18 and 19.

The sealant 26 is formed by screen mask printing using an adhesive agent such as a thermo-hardening epoxy resin or the like.

The spacer 27 is formed of a glass fiber or plastic material. The spacer 27 is dispersed by a wet dispersion method by mixing a spacer with a solvent to be dispersed and a dry dispersion method by dispersing a spacer without conglomeration by electrically charging the spacer and maintaining a grounded state for the substrate.

Specifically, photolithography is also applied in the case when the spacer 27 has a pattern shape.

Unfortunately, the method of forming the pattern according to the related art has the following problem or disadvantages.

First of all, the photoresist is patterned by sequential steps of coating, exposure, development, etching, and stripping. Hence, the sequential steps for patterning the photoresist are complicated and vexatious.

Secondly, the equipment which is utilized occupies too large a space and process time and expenses are wasted.

SUMMARY OF THE INVENTION

Accordingly, the present invention is directed to a method of forming a pattern that substantially obviates one or more problems due to limitations and disadvantages of the related art.

An object of the present invention is to provide a method of forming a pattern suitable for fabricating a liquid crystal display device, which provides a savings in process time and process expense by forming a resist pattern in a simple manner.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the present invention, as embodied and broadly described herein, a method of forming a pattern according to the present invention includes the steps of forming a film on a substrate, printing a resist pattern by covering the film with a screen mask, etching the film under the resist pattern used as a mask, and stripping the resist pattern.

It is to be understood that both the foregoing general description and the following detailed description of the present invention are exemplary and explanatory and are intended to provide further explanation of the invention as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 3A to 3D illustrate cross-sectional views of a method of forming a pattern according to the present invention.

Figure 1A:
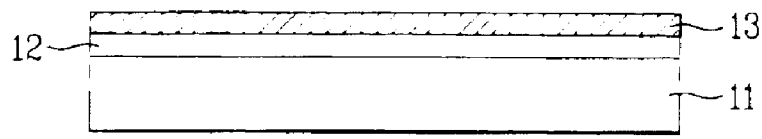
FIGS. 1A to 1D illustrate cross-sectional views of a method of forming a pattern according to related art.
Figure 1B:
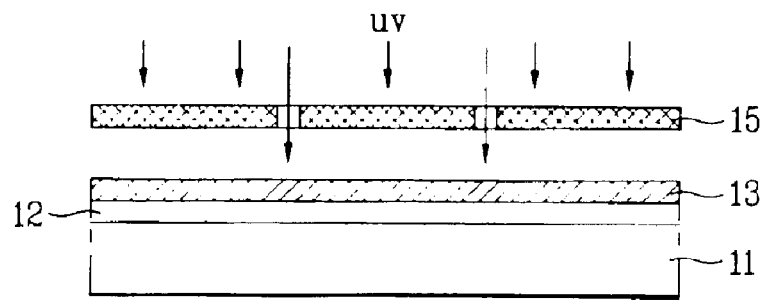
Figure 1C:
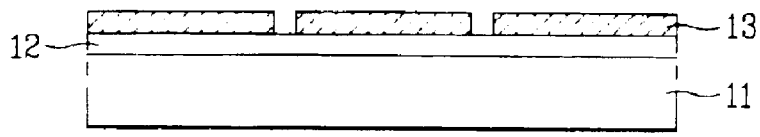
Figure 1D:
Figure 2:
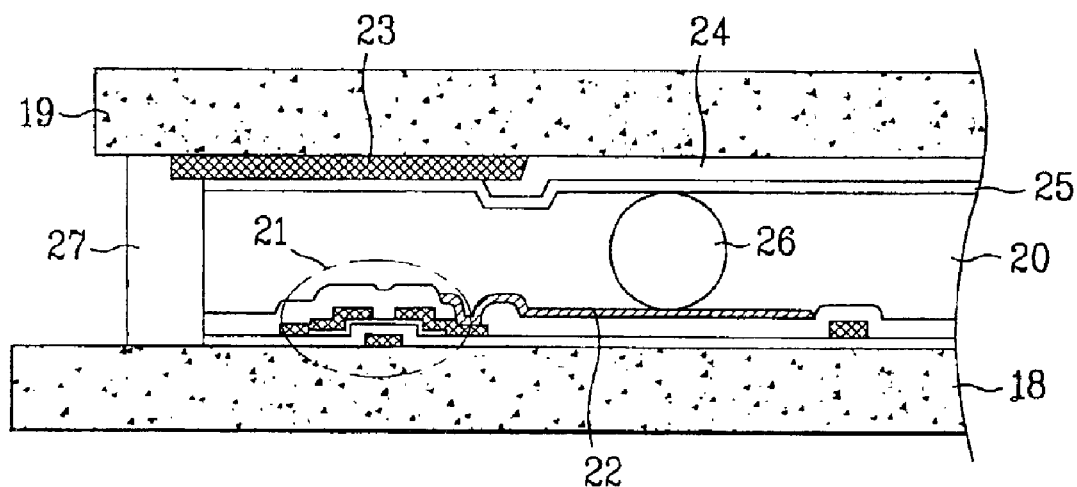
FIG. 2 illustrates a cross-sectional view of a general liquid crystal display device.
Figure 3A:
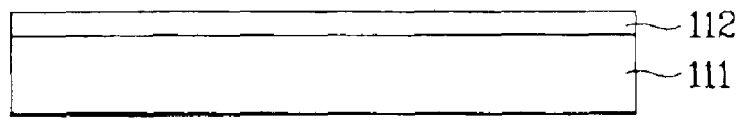
FIGS. 3A to 3D illustrate cross-sectional views of a method of forming a pattern according to the present invention.

Referring to FIG. 3A, a film 112 as an etch target is deposited at a required thickness on a substrate 111 by sputtering or CVD (chemical vapor deposition).

In this case, the film 112 is a line forming material, an electrode material, or an insulating material.

Figure 3B:
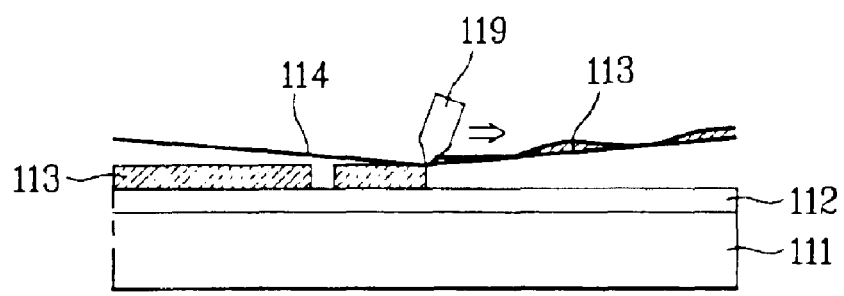

Referring to FIG. 3B, a screen mask 114 is aligned over the substrate 111, a resist 113a is dropped on the screen mask 114, and the resist 113a is squeezed in one direction by a squeezer sequentially 119 made of rubber, or the like.

Figure 3C:
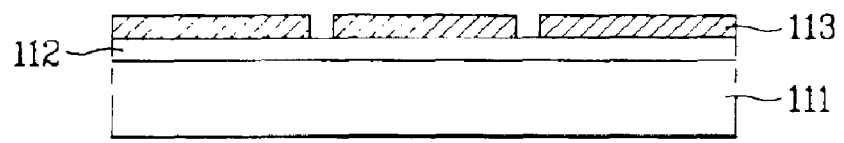

Hence, the resist 113a is printed on the film 112 with a predetermined shape through the openings in the screen mask 114, thereby forming a resist pattern 113 shown in FIG. 3C.

Subsequently, portions of the film 112 is selectively removed using the resist pattern 113 as a mask, thereby forming a pattern having a desired shape.

In this case, an etching process of the film 112 using the resist pattern 113 as a mask can be carried out by a dry etching method using plasma or a wet etching method using a chemical solution.

Figure 3D:

After the film has been etched, the resist pattern 113 is stripped so that only the patterned film 112, as shown in FIG. 3D, remains on the substrate 111.

The stripper for stripping the resist film 113 off the film 112 can be classified into an organic based material, an inorganic based material, and a water based material. Also, a cleaning process can be carried out using isopropyl alcohol (IPA) to prevent the resist from reattaching after the stripping process.

Therefore, the present invention forms the resist pattern 113 by screen printing, thereby, more easily enabling the carrying out of the photolithography process.

Figure 4A:
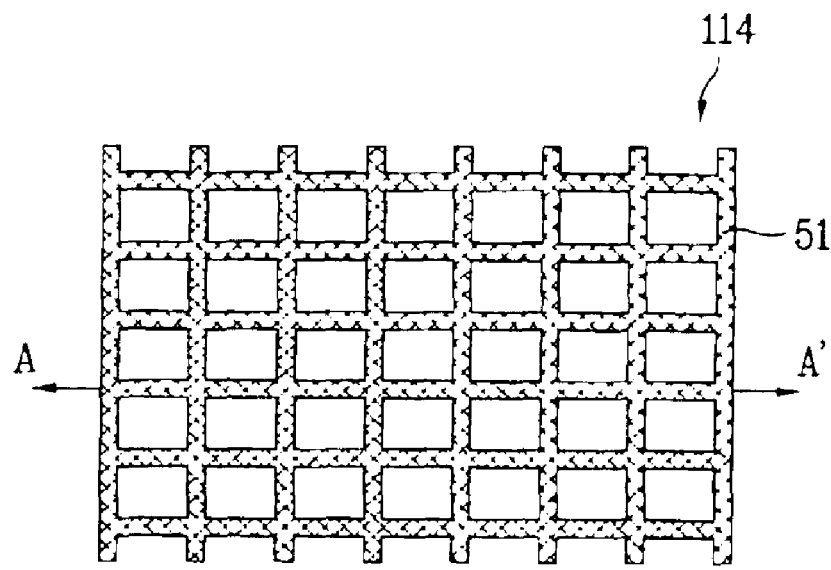
FIG. 4A and FIG. 4B illustrate respective layout and a cross-sectional views of a screen mask according to the present invention.
Figure 4B:
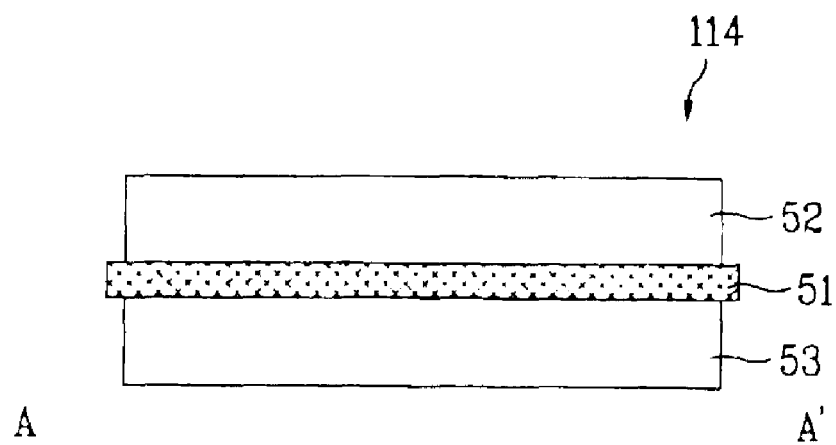

FIG. 4A and FIG. 4B illustrate a layout and a cross-sectional view of a screen mask according to the present invention, respectively.

Referring to FIG. 4A and FIG. 4B, a screen mask 114 used for the screen printing method includes a mask substrate 51 made of aluminum (Al), first and second emulsion layers 52 and 53 coated on top and bottom surfaces of the mask substrate 51, respectively, a plurality of apertures defining an open portion, and a structure portion, which defines a shielding portion.

Thus, the first and second emulsion layers 52 and 53 are coated on the inner and outer surfaces of the mask substrate 51 containing the mesh shown in FIG. 4A. Exposure is carried out on the first and second emulsion layers 52 and 53 through the open portions of the mask substrate 51, and the exposed first and second emulsion layers 52 and 53 are developed to pattern the first and second emulsion layers 52 and 53, in order.

Hence, portions of the first and second emulsion layers 52 and 53 corresponding to the open portions of the mask substrate 51 are removed, and the resist is printed through the removed portions.

In this case, the mask substrate 51 is made of aluminum and a material that visible rays or UV-rays do not penetrate or transmit. The first and second emulsion layers 52 and 53 are made of polymers mixed with photosensitive compounds such as photoacryl compounds, resist, and the like.

Meanwhile, since the pattern applied to the liquid crystal display device has a micro size, it is inevitable that the screen mask is prepared to be suitable for such micro size.

In order to define the micro pattern, the size of the open portion of the screen mask and a thickness of the emulsion layers are adjusted.

Figure 5A:
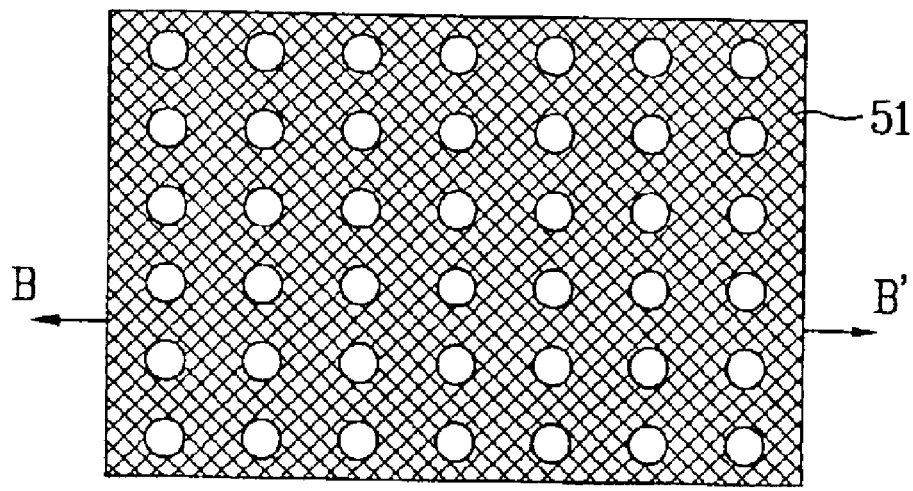
FIG. 5A and FIG. 5B illustrate respective layout and a cross-sectional views of a screen mask for forming a micro pattern according to the present invention.
Figure 5B:
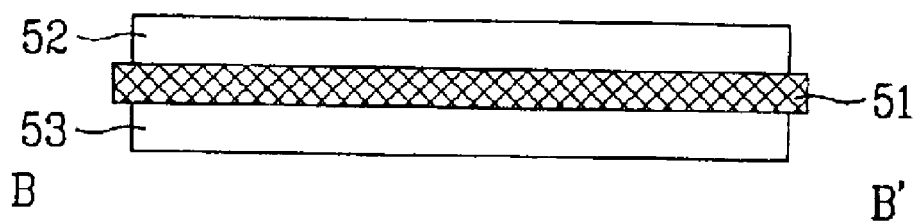

FIG. 5A and FIG. 5B illustrate a layout and a cross-sectional view of a screen mask used for forming a micro pattern according to the present invention.

If the size of an open portion of the mask substrate 51 is reduced as shown in FIG. 5A, or if the thickness of each of the first and second emulsion layers 52 and 53 are decreased as shown in FIG. 5B, the resist pattern is correspondingly printed in a small size to pattern the film with micro size. In this case, as the size of the open portion of the mask substrate 51 or the thickness of each of the first and second emulsion layers 52 and 53 increases. Also, so does the quantity of the resist printed through the open portion of the screen mask.

Hence, various patterns differing in size can be formed in accordance with the preparation of the screen mask, thereby rendering the screen mask applicable to the pattern formation of the liquid crystal display device.

The method of forming the pattern according to the present invention has the following effects or advantages.

First of all, the resist pattern is formed by screen printing to replace the steps of resist coating, exposure, and development in previous photolithography. Therefore, the present invention remarkably simplifies the method of forming a pattern, thereby improving productivity.

Secondly, the size of the open portion of the screen mask and the thickness of the emulsion layers if the mask can be adjusted to form various patterns thereby enabling one to define the micro pattern more easily.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming a pattern, comprising the steps of:
   forming a film on a substrate;
   printing a resist pattern by covering the film with a screen mask;
   etching the film using the resist pattern used as a mask; and
   stripping the resist pattern to form a patterned film,
   wherein the screen mask comprises a metal layer and emulsion layers provided on the top and bottom of the metal layer.

2. The method of claim 1, wherein the size of the pattern in the patterned film depends on the thickness of each of the emulsion layers and the size of opening portions of the screen mask.

3. The method of claim 1, wherein the metal layer is made of a material that visible rays or UV-rays do not penetrate.

4. The method of claim 3, wherein the metal layer is made of aluminum.

5. The method of claim 1, wherein each of the first and second emulsion layers is formed of a polymer mixed with a photosensitive compound.

6. A method of forming a pattern which comprises:
   forming a film on a substrate in a form of a composite;
   positioned a screen mask over the composite;
   applying a resist material to the screen mask to form a resist pattern on the film, the resist material being dropped onto the screen mask where it is sequentially squeezed in one direction; and
   forming a pattern by selectively removing portions of the film using the resist pattern as a mask.

* * * * *